(12) United States Patent
Wei et al.

(10) Patent No.: US 9,196,499 B2
(45) Date of Patent: Nov. 24, 2015

(54) METHOD OF FORMING SEMICONDUCTOR FINS

(71) Applicant: GLOBALFOUNDRIES Inc., Grand Cayman (KY)

(72) Inventors: Andy Chih-Hung Wei, Queensbury, NY (US); Dae-han Choi, Loudonville, NY (US); Dae Geun Yang, Watervliet, NY (US); Xiang Hu, Clifton Park, NY (US); Mariappan Hariharaputhiran, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/225,542

(22) Filed: Mar. 26, 2014

(65) Prior Publication Data

US 2015/0279684 A1    Oct. 1, 2015

(51) Int. Cl.
*H01L 21/475* (2006.01)
*H01L 21/308* (2006.01)
*H01L 21/311* (2006.01)
*H01L 21/306* (2006.01)
*H01L 21/762* (2006.01)
*H01L 29/66* (2006.01)
*H01L 21/033* (2006.01)
*H01L 21/8234* (2006.01)

(52) U.S. Cl.
CPC ........ *H01L 21/3081* (2013.01); *H01L 21/0332* (2013.01); *H01L 21/30604* (2013.01); *H01L 21/31111* (2013.01); *H01L 21/475* (2013.01); *H01L 21/76224* (2013.01); *H01L 21/823431* (2013.01); *H01L 29/66795* (2013.01)

(58) Field of Classification Search
CPC ................................................ H01L 21/823431
See application file for complete search history.

(56) References Cited

U.S. PATENT DOCUMENTS

| | | | |
|---|---|---|---|
| 8,466,012 B1 | 6/2013 | Chang et al. | |
| 8,617,996 B1 * | 12/2013 | Chi et al. | 438/700 |
| 8,658,536 B1 * | 2/2014 | Choi et al. | 438/699 |
| 8,753,940 B1 * | 6/2014 | Wei et al. | 438/283 |
| 2012/0168913 A1 | 7/2012 | Toh et al. | |
| 2013/0309838 A1 * | 11/2013 | Wei et al. | 438/424 |
| 2013/0330889 A1 * | 12/2013 | Yin et al. | 438/197 |
| 2014/0145247 A1 * | 5/2014 | Cheng et al. | 257/288 |
| 2014/0273464 A1 * | 9/2014 | Shieh et al. | 438/700 |
| 2015/0115418 A1 * | 4/2015 | Wei et al. | 257/639 |

* cited by examiner

*Primary Examiner* — Stephen W Smoot
(74) *Attorney, Agent, or Firm* — Williams Morgan, P.C.

(57) ABSTRACT

Embodiments of the present invention provide methods of removing fin portions from a finFET. At a starting point, a high-K dielectric layer is disposed on a substrate. A fin hardmask and lithography stack is deposited on the high-k dielectric. A fin hardmask is exposed, and a first portion of the fin hardmark is removed. The lithography stack is removed. A second portion of the fin hardmask is removed. Fins are formed. A gap fill dielectric is deposited and recessed.

20 Claims, 10 Drawing Sheets

METHOD OF FORMING SEMICONDUCTOR FINS

FIELD OF THE INVENTION

The present invention relates generally to semiconductor fabrication, and more particularly, to method of forming semiconductor fins.

BACKGROUND

As integrated circuits continue to scale downward in size, the finFET (fin type field effect transistor) is becoming an attractive device for use with modern semiconductor devices. In a finFET, the channel is traditionally formed by a semiconductor fin, and a gate electrode is located and wrapped around the fin. Typically fins are formed as uniform lines on a semiconductor substrate. Then, fin removal processes are used to remove unneeded fin portions. As critical dimensions and pitches decrease, removing the unneeded fin portions with standard lithography and etch techniques becomes more challenging. It is therefore desirable to have improvements in methods of forming semiconductor fins.

SUMMARY

Embodiments of the present invention provide methods of removing fin portions from a finFET. At a starting point, a high-K dielectric layer is disposed on a substrate. A fin hardmask and lithography stack is deposited on the high-k dielectric. A fin hardmask is exposed, and a first portion of the fin hardmark is removed. The lithography stack is removed. A second portion of the fin hardmask is removed. Fins are formed. A gap fill dielectric is deposited and recessed.

A first aspect of embodiments of the present invention provide a method of forming a semiconductor structure, including: depositing a high-K dielectric layer on a semiconductor substrate; forming a plurality of fin hardmask regions disposed on the high-K dielectric layer; depositing a lithography stack on the semiconductor structure; performing a first etch into the lithography stack to expose a portion of at least one fin hardmask region, the hardmask region being comprised of a first hardmask portion disposed on a second hardmask portion, wherein a subset of fin hardmask regions remain covered by the lithography stack; performing a second etch to remove the first hardmask portion of the exposed hardmask region; removing the lithography stack; performing a third etch to remove the second hardmask portion of the exposed hardmask region; performing a substrate recess to form fins at locations of the subset of fin hardmask regions that remain covered by the lithography stack; and removing the subset of fin hardmask regions.

A second aspect of embodiments of the present invention provide a method of forming a semiconductor structure, including: depositing an aluminum oxide dielectric layer on a semiconductor substrate; forming a plurality of fin hardmask regions disposed on the high-K dielectric layer; depositing a lithography stack on the semiconductor structure; performing a first etch into the lithography stack to expose a portion of at least one fin hardmask region, the hardmask region being comprised of a silicon nitride portion disposed on a silicon oxide portion, wherein a subset of fin hardmask regions remain covered by the lithography stack; performing a second etch to remove the silicon nitride portion of the exposed hardmask region; removing the lithography stack; performing a third etch to remove the silicon oxide portion of the exposed hardmask region; performing a substrate recess to form fins at locations of the subset of fin hardmask regions that remain covered by the lithography stack; and removing the subset of fin hardmask regions.

A third aspect of embodiments of the present invention provide a method of forming a semiconductor structure, including: depositing a high-K dielectric layer on a semiconductor substrate; forming a plurality of fin hardmask regions disposed on the high-K dielectric layer; depositing a lithography stack on the semiconductor structure; performing a first etch into the lithography stack to expose only a portion of at least one fin hardmask region, the hardmask region being comprised of a silicon nitride portion disposed on a silicon oxide portion, wherein a subset of fin hardmask regions remain covered by the lithography stack; performing a second etch to remove the silicon nitride portion of the exposed hardmask region; removing the lithography stack; performing a third etch to remove the silicon oxide portion of the exposed hardmask region; performing a substrate recess to form fins at locations of the subset of fin hardmask regions that remain covered by the lithography stack; depositing a gap fill dielectric layer over the fins; and recessing the gap fill dielectric layer to a level below a top of the fins.

BRIEF DESCRIPTION OF THE DRAWINGS

These and other features of this invention will be more readily understood from the following detailed description of the various aspects of the invention taken in conjunction with the accompanying drawings in which.

Figure 1:
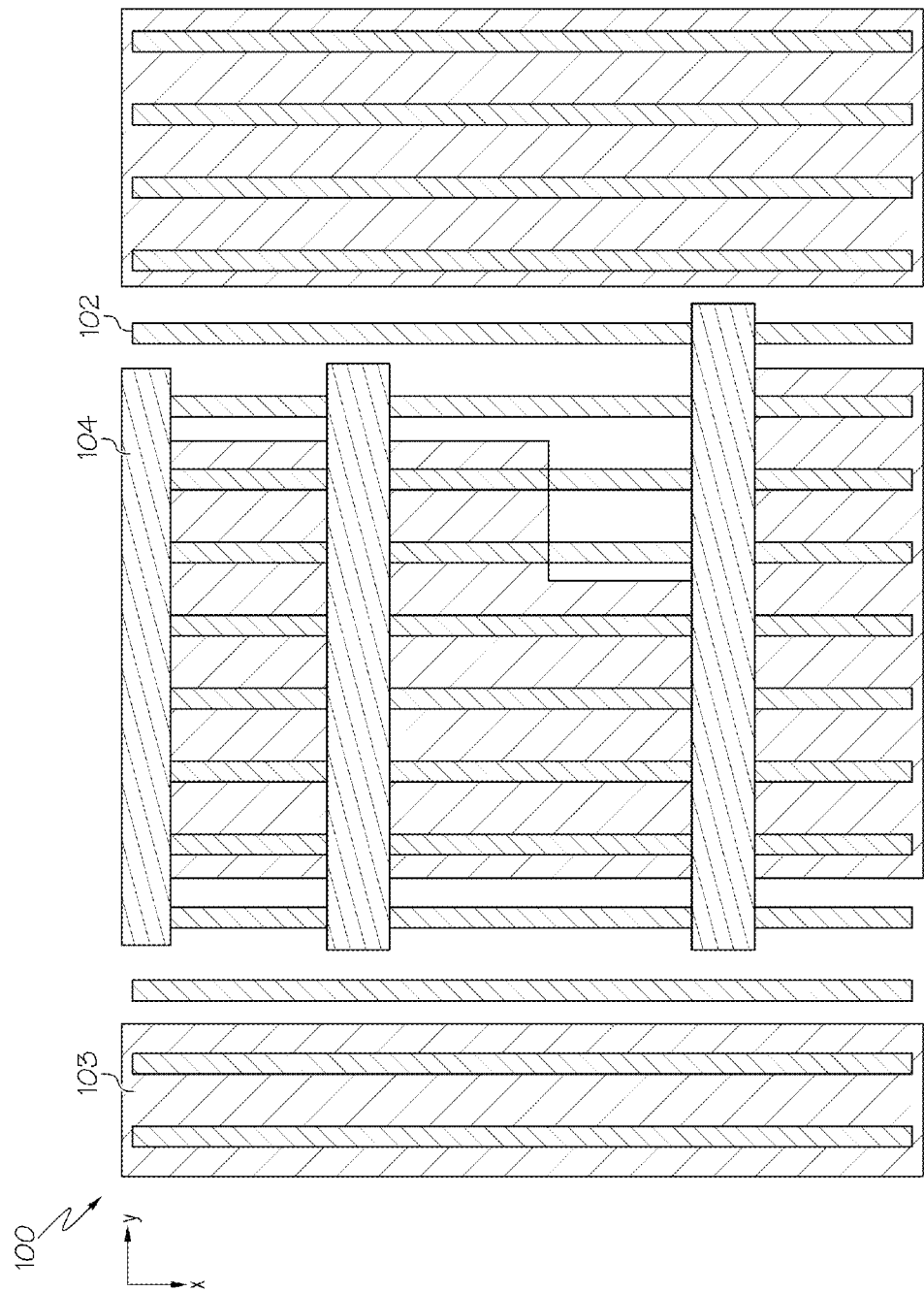
FIG. 1 shows a top-down view of a semiconductor structure at a starting point for embodiments of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

FIG. 1 shows a top-down view of a semiconductor structure 100 at a starting point for embodiments of the present invention. The semiconductor structure 100 has a set (at least one) of fins 102 deposited on a substrate, e.g., a silicon wafer (shown as 106 at FIG. 2). A fin preserve mask 103 is deposited over a portion of a subset (at least one) of the set of fins 102. A cut mask 104 is deposited over a portion of a subset (at least one) of the set of fins 102.

Figure 2:
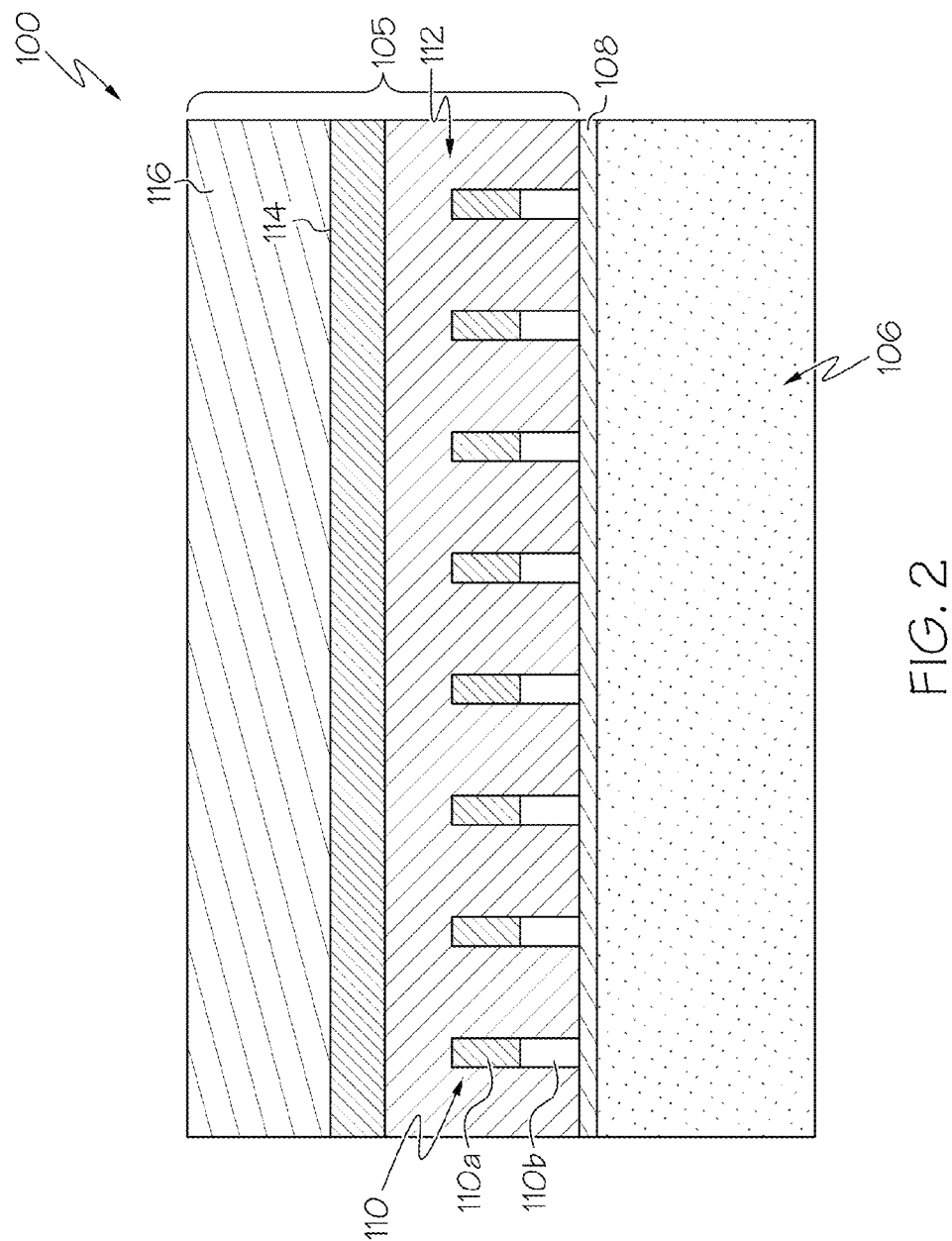
FIG. 2 shows a cross section of a semiconductor structure including fin hardmask regions and a lithography stack in accordance with embodiments of the present invention.

FIG. 2 shows a cross section of a semiconductor structure including fin hardmask regions and a lithography stack in accordance with embodiments of the present invention. As shown, a high-K dielectric 108 is disposed on semiconductor substrate 106. In some embodiments, the high-K dielectric 108 may have a dielectric constant K that is greater than or equal to 4. In some embodiments, the high-K dielectric 108 may be aluminum oxide, hafnium oxide, a combination of each, or any other suitable material. A lithography stack, shown generally at 105, is deposited on the high-K dielectric 108. The lithography stack 105 may comprise a carbon (C) layer 112, a silicon nitride (SiN) layer 114, and a photoresist layer 116. At set (at least one) of hardmask regions 110 is disposed over the high-K dielectric 108. Each hardmask region of the set of hardmark regions 110 has a first portion 110a, which in some embodiments may comprise silicon nitride, and a second portion 110b, which in some embodiments, may comprise silicon oxide (SiO2). A layer of carbon 112 is disposed over the set of hardmask regions 110. A layer of silicon nitride 114 is disposed over the carbon layer 112. In some embodiments, the height of the silicon nitride layer 112 may range from about 20 nanometers (nm) to about 45 nanometers. A photoresist layer 116 is disposed over the silicon layer 114.

Figure 3:
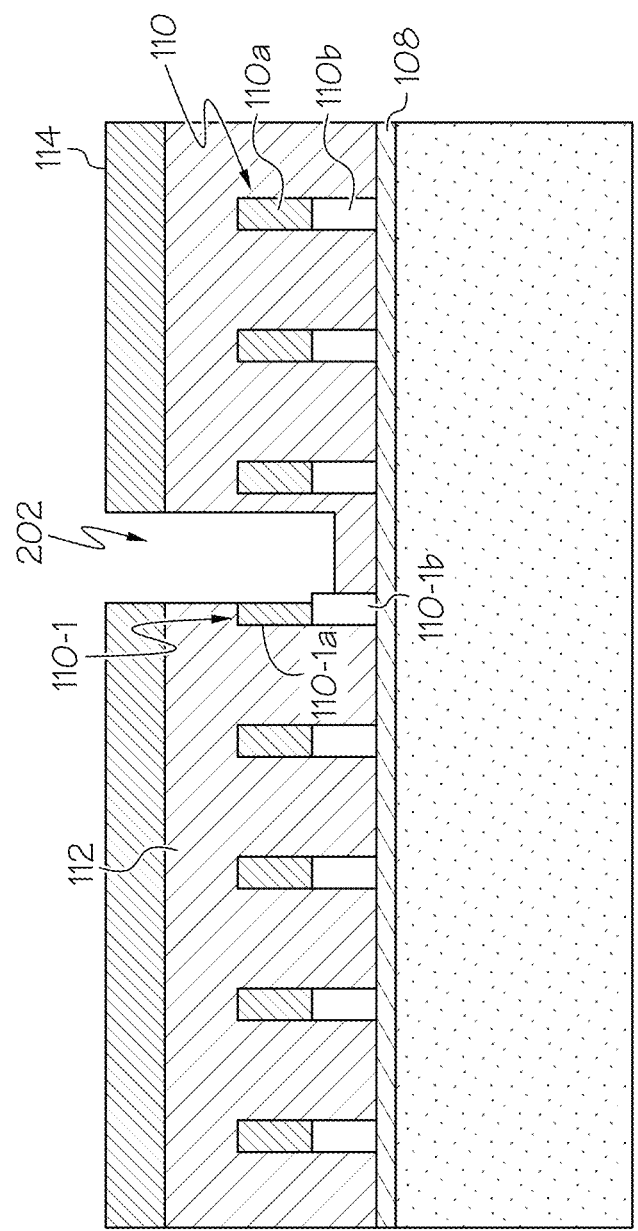
FIG. 3 shows a cross section of a semiconductor structure after a subsequent process step of exposing a fin hardmask region in accordance with embodiments of the present invention.

FIG. 3 shows a cross section of a semiconductor structure after a subsequent process step of exposing a fin hardmask region in accordance with embodiments of the present invention. The photoresist 116 is removed by industry standard processes. A first etch is then performed to form a cavity, shown generally at 202, through the remaining portion of the lithography stack (silicon nitride layer 114 and carbon layer 112). The cavity 202 is intended to expose an entire fin hardmask 110 for subsequent etch removal. However, in some embodiments, when the cavity 202 is created, one or more of the set of hardmask regions 110 may only be partially exposed. An example is shown at hardmask region 110-1, which has a first portion 110-1a and a second portion 110-1b, which are equivalent to first portion 110a and second portion 110b, respectively. In some embodiments, the first etch is a reactive ion etch or any other suitable technique now known or hereafter developed.

Figure 4:
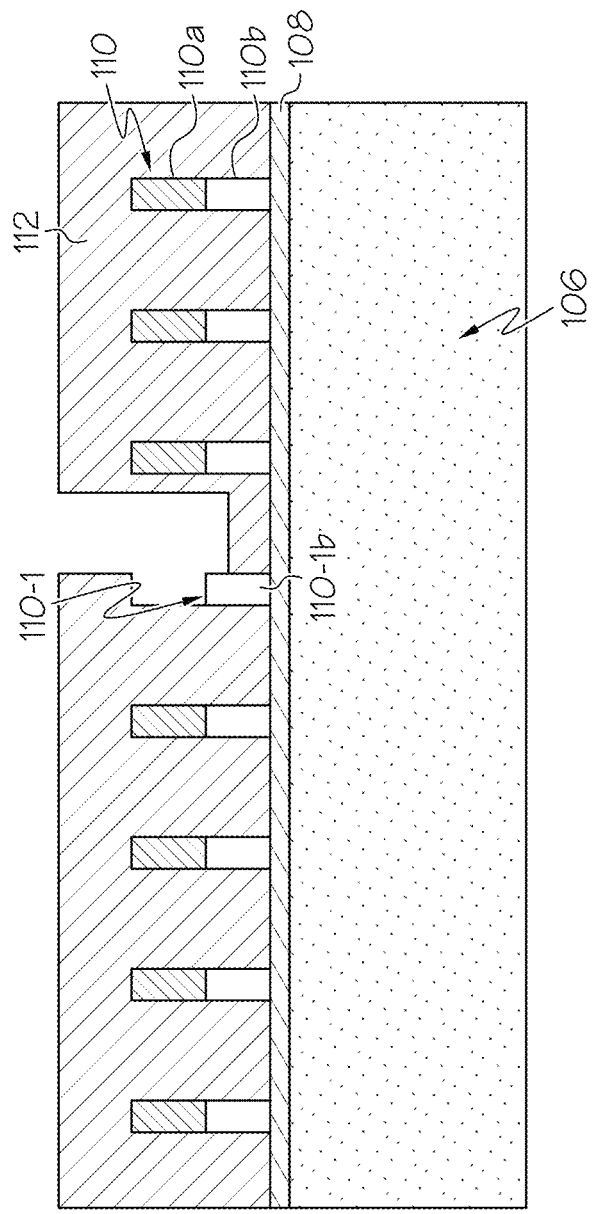
FIG. 4 shows a cross section of a semiconductor structure after a subsequent process step of removing a first portion of a fin hardmask region in accordance with embodiments of the present invention.

FIG. 4 shows a cross section of a semiconductor structure after a subsequent process step of performing a second etch to remove a first portion 110-1a of a fin hardmask region 110-1 in accordance with embodiments of the present invention. In some embodiments, the second etch is an isotropic etch or any other suitable technique, now known or hereafter developed. The silicon nitride layer 114 is also removed during this process.

Figure 5:
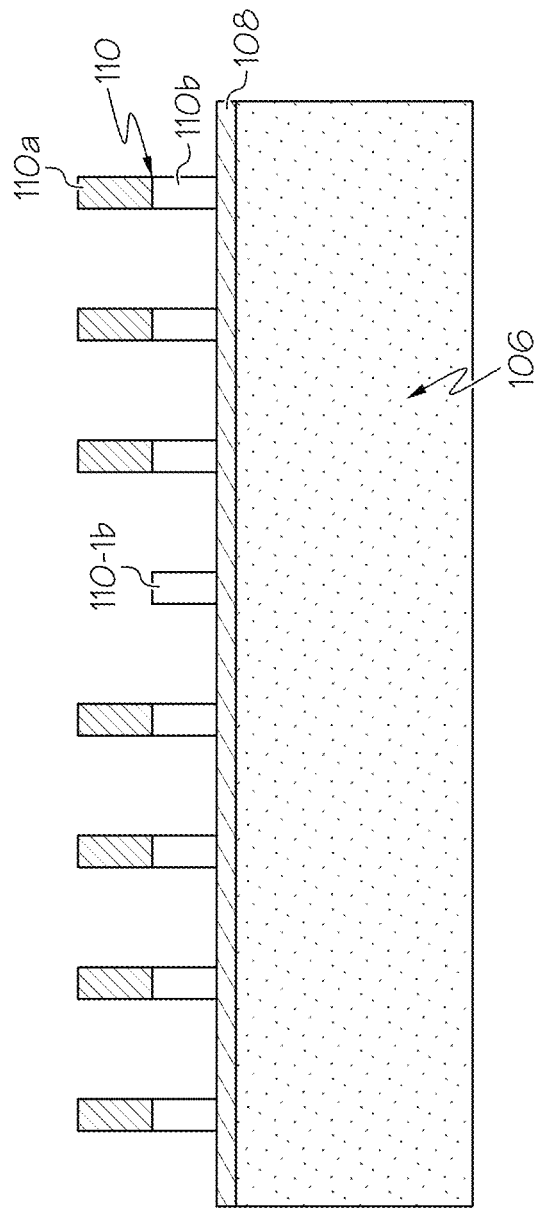
FIG. 5 shows a cross section of a semiconductor structure after a subsequent process step of removing the carbon layer in accordance with embodiments of the present invention.

FIG. 5 shows a cross section of a semiconductor structure after a subsequent process step of removing the carbon layer 112 in accordance with embodiments of the present invention. In some embodiments, this is achieved by a selective etch process, or any other suitable technique now known or hereafter developed.

Figure 6:
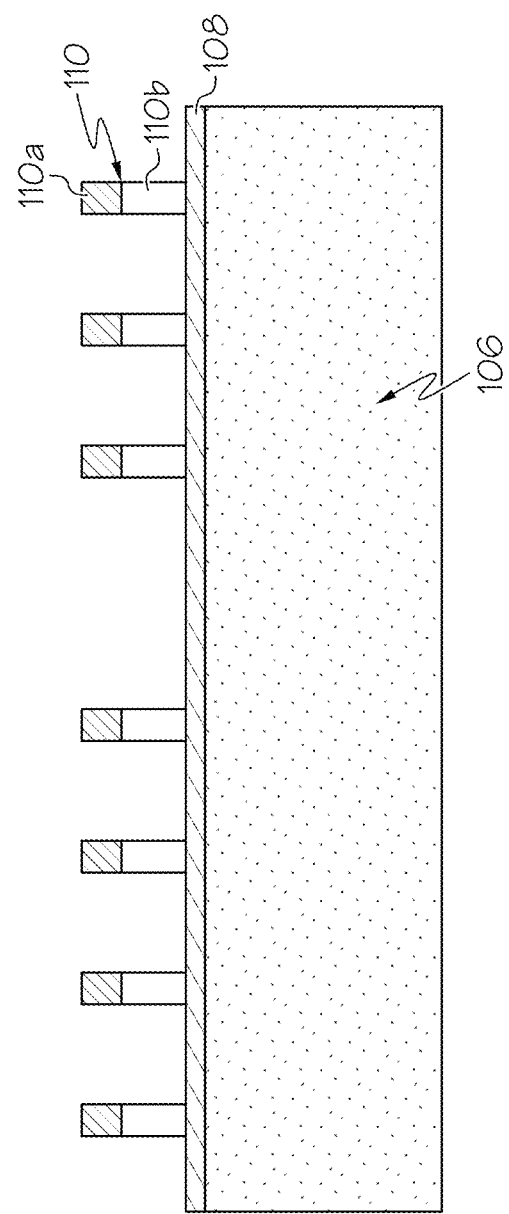
FIG. 6 shows a cross section of a semiconductor structure after a subsequent process step of removing a second portion of a fin hardmask region in accordance with embodiments of the present invention.

FIG. 6 shows a cross section of a semiconductor structure after a subsequent process step of performing a third etch to remove a second portion 110b-1 (see FIG. 5) of a fin hardmask region 110-1 in accordance with embodiments of the present invention. In some embodiments, the third etch is an anisotropic etch, such as a selective reactive ion etch, that is highly selective to the high-k layer 108, which serves as an etch stop layer, or any other suitable technique now known or hereafter developed.

Figure 7:
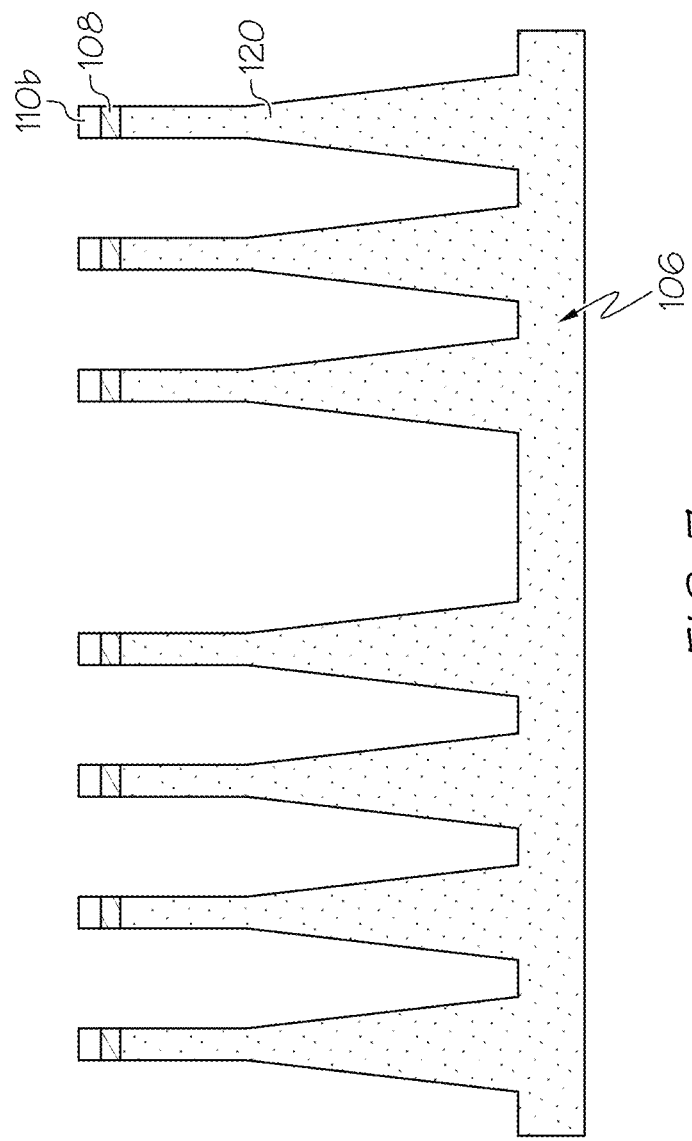
FIG. 7 shows a cross section of a semiconductor structure after a subsequent process step of forming fins in accordance with embodiments of the present invention.

FIG. 7 shows a cross section of a semiconductor structure after a subsequent process step of forming fins in accordance with embodiments of the present invention. First portion 110a of each of the set of hardmask regions 110 is removed. Substrate 106 is recessed to form fins 120 under each remaining (unremoved) hardmask region of the set of hardmask regions 110.

Figure 8:
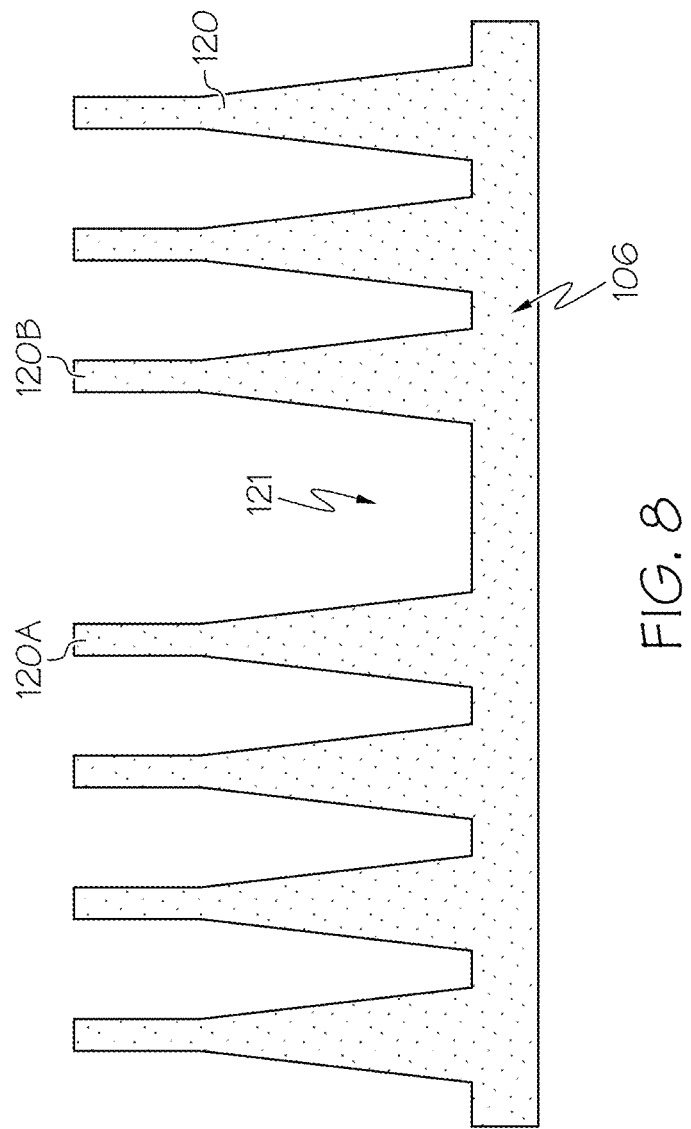
FIG. 8 shows a cross section of a semiconductor structure after a subsequent process step of removing the remaining fin hardmask region and high-K dielectric in accordance with embodiments of the present invention.

FIG. 8 shows a cross section of a semiconductor structure after a subsequent process step of removing the remaining first portion 110a of each remaining hardmask region of the set of hardmask regions 110 and high-K dielectric 108 in accordance with embodiments of the present invention. In some embodiments, this may be achieved using multiple etch processes. In some embodiments, a combination of chlorine based etch processes and fluorine based etch processes may be used. In some embodiments, any suitable etch technique now known or hereafter developed may be used. As a result of embodiments of the present invention, there is no fin formed in region 121 of the structure, while the fin 120A and fin 120B that are adjacent to region 121 are preserved, and remain undamaged.

Figure 9:
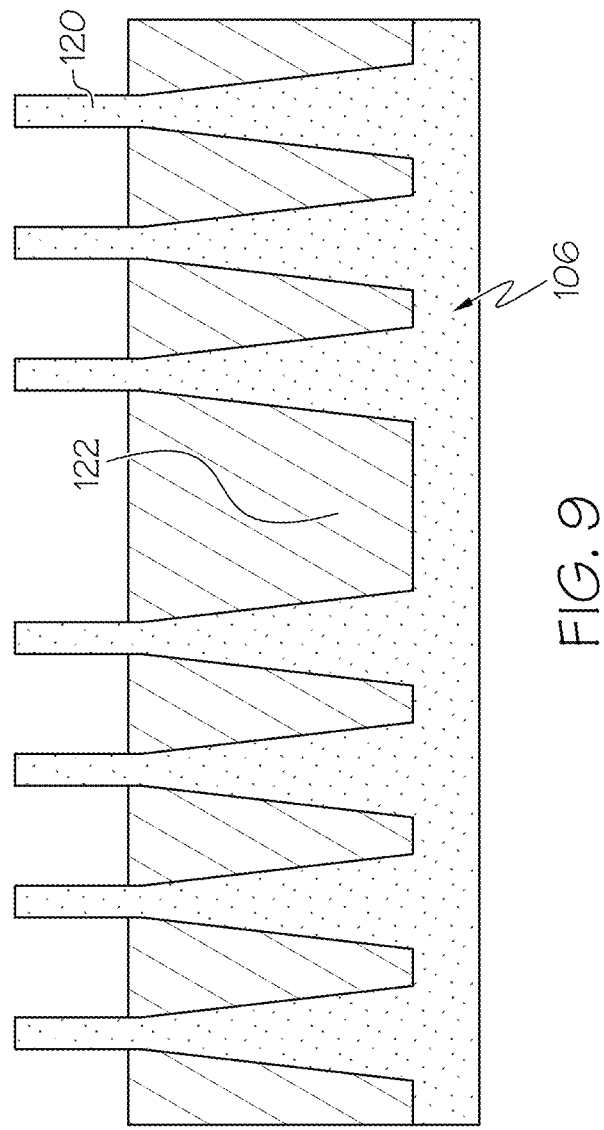
FIG. 9 shows a cross section of a semiconductor structure after a subsequent process step of depositing a gap fill dielectric in accordance with embodiments of the present invention.

FIG. 9 shows a cross section of a semiconductor structure after a subsequent process step of depositing a gap fill dielectric 122 in accordance with embodiments of the present invention. Subsequent to depositing, the gap fill dielectric 122 may be recessed to a level below the tops of the fins 120. In some embodiments, the gap fill dielectric 122 may be deposited by a chemical vapor deposition (CVD) process. In some embodiments, the gap fill dielectric 122 may be a flowable oxide. Preferably, a self-planarizing material is used.

Figure 10:
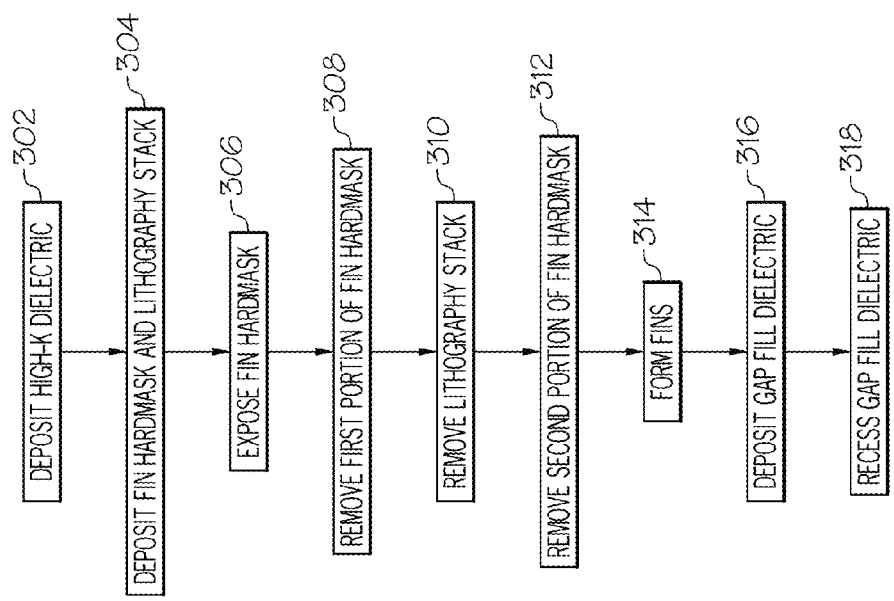
FIG. 10 is a flowchart indicating process steps for embodiments of the present invention.

FIG. 10 is a flowchart indicating process steps for embodiments of the present invention. At 302, a high-K dielectric layer is disposed on a substrate. At 304, a fin hardmask and lithography stack is deposited on the high-k dielectric. At 306, a fin hardmask is exposed. At 308, a first portion of the fin hardmark is removed. At 310, the lithography stack is removed. At 312, a second portion of the fin hardmask is removed. At 314, fins are formed. At 316, a gap fill dielectric is deposited. At 318, the gap fill dielectric is recessed. From this point forward, industry-standard techniques, including additional dielectric, via, and metallization layers, and packaging, may be used to complete the fabrication of the integrated circuit (IC).

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
   depositing a high-K dielectric layer on a semiconductor substrate;
   forming a plurality of fin hardmask regions disposed on the high-K dielectric layer;
   depositing a lithography stack on the semiconductor structure;
   performing a first etch into the lithography stack to expose a portion of at least one fin hardmask region, the hardmask region being comprised of a first hardmask portion disposed on a second hardmask portion, wherein a subset of fin hardmask regions remain covered by the lithography stack;
   performing a second etch to remove the first hardmask portion of the exposed hardmask region;
   removing the lithography stack;
   performing a third etch to remove the second hardmask portion of the exposed hardmask region;
   performing a substrate recess to form fins at locations of the subset of fin hardmask regions; and
   removing the subset of fin hardmask regions.

2. The method according to claim 1, wherein the depositing a high-K dielectric layer comprises depositing aluminum oxide.

3. The method according to claim 1, wherein the depositing a high-K dielectric layer comprises depositing hafnium oxide.

4. The method according to claim 1, wherein the depositing a lithography stack comprises:
   depositing a carbon layer on the high-K dielectric layer and fin hardmask regions;
   depositing a nitride layer on the carbon layer; and
   depositing a photoresist layer on the nitride layer.

5. The method according to claim 1, wherein the performing a first etch into the lithography stack to expose a portion of at least one fin hardmask region comprises performing a reactive ion etch.

6. The method according to claim 1, wherein the performing a second etch to remove the first hardmask portion of the exposed hardmask region comprises performing an isotropic etch.

7. The method according to claim 1, wherein the performing a third etch to remove the second hardmask portion of the exposed hardmask region comprises performing an anisotropic etch.

8. A method of forming a semiconductor structure, comprising:
   depositing an aluminum oxide dielectric layer on a semiconductor substrate;
   forming a plurality of fin hardmask regions disposed on the aluminum oxide dielectric layer;
   depositing a lithography stack on the semiconductor structure;
   performing a first etch into the lithography stack to expose a portion of at least one fin hardmask region, the hardmask region being comprised of a silicon nitride portion disposed on a silicon oxide portion, wherein a subset of fin hardmask regions remain covered by the lithography stack;
   performing a second etch to remove the silicon nitride portion of the exposed hardmask region;
   removing the lithography stack;
   performing a third etch to remove the silicon oxide portion of the exposed hardmask region;
   performing a substrate recess to form fins at locations of the subset of fin hardmask regions; and
   removing the subset of fin hardmask regions.

9. The method according to claim 8, wherein the depositing a lithography stack comprises:
   depositing a carbon layer on the aluminum oxide dielectric and fin hardmask regions;
   depositing a nitride layer on the carbon layer; and
   depositing a photoresist layer on the nitride layer.

10. The method according to claim 8, wherein the performing a first etch into the lithography stack to expose a portion of at least one fin hardmask region comprises performing a reactive ion etch.

11. The method according to claim 8, wherein the performing a second etch comprises performing an isotropic etch selective to silicon nitride.

12. The method according to claim 8, wherein the performing a third etch comprises performing an anisotropic etch.

13. The method according to claim 8, further comprising removing the aluminum oxide layer after the step of performing a third etch to remove the silicon oxide portion of the exposed hardmask region.

14. The method according to claim 8, wherein the removing the aluminum oxide layer is performed using a chlorine-based etch process.

15. A method of forming a semiconductor structure, comprising:
    depositing a high-K dielectric layer on a semiconductor substrate;
    forming a plurality of fin hardmask regions disposed on the high-K dielectric layer;
    depositing a lithography stack on the semiconductor structure;
    performing a first etch into the lithography stack to expose only a portion of at least one fin hardmask region, the hardmask region being comprised of a silicon nitride portion disposed on a silicon oxide portion, wherein a subset of fin hardmask regions remain covered by the lithography stack;
    performing a second etch to remove the silicon nitride portion of the exposed hardmask region;
    removing the lithography stack;
    performing a third etch to remove the silicon oxide portion of the exposed hardmask region;
    performing a substrate recess to form fins at locations of the subset of fin hardmask regions;
    depositing a gap fill dielectric layer over the fins; and
    recessing the gap fill dielectric layer to a level below a top of the fins.

16. The method according to claim 15, wherein the depositing a high-K dielectric layer comprises depositing aluminum oxide.

17. The method according to claim 15, wherein the depositing a high-K dielectric layer comprises depositing hafnium oxide.

18. The method according to claim 15, wherein the depositing a lithography stack comprises:
    depositing a carbon layer on the high-K dielectric layer and fin hardmask regions;
    depositing a nitride layer on the carbon layer; and
    depositing a photoresist layer on the nitride layer.

19. The method according to claim 15, wherein the performing a first etch into the lithography stack to expose a portion of at least one fin hardmask region comprises performing a reactive ion etch.

20. The method according to claim 15, wherein the performing a second etch to remove the silicon nitride portion of the exposed hardmask region comprises performing an isotropic etch.

* * * * *